US012622092B2

(12) United States Patent
Muramatsu et al.

(10) Patent No.: US 12,622,092 B2
(45) Date of Patent: May 5, 2026

(54) PHOTODETECTOR

(71) Applicant: HAMAMATSU PHOTONICS K.K., Hamamatsu (JP)

(72) Inventors: Masaharu Muramatsu, Hamamatsu (JP); Yasuhito Yoneta, Hamamatsu (JP); Hiroya Kobayashi, Hamamatsu (JP); Tetsuya Abe, Hamamatsu (JP); Kenichiro Taniguchi, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 281 days.

(21) Appl. No.: 17/762,847

(22) PCT Filed: Aug. 28, 2020

(86) PCT No.: PCT/JP2020/032645
§ 371 (c)(1),
(2) Date: Mar. 23, 2022

(87) PCT Pub. No.: WO2021/065272
PCT Pub. Date: Apr. 8, 2021

(65) Prior Publication Data
US 2022/0344520 A1 Oct. 27, 2022

(30) Foreign Application Priority Data

Sep. 30, 2019 (JP) ................................ 2019-179193

(51) Int. Cl.
*H10F 77/00* (2025.01)
*H10F 39/12* (2025.01)
*H10F 77/50* (2025.01)
(52) U.S. Cl.
CPC ............. *H10F 77/93* (2025.01); *H10F 39/12* (2025.01); *H10F 77/50* (2025.01)

(58) Field of Classification Search
None
See application file for complete search history.

(56) References Cited

U.S. PATENT DOCUMENTS 6,649,824 B1 * 11/2003 Den ..................... H10K 30/152
136/258
2004/0212055 A1 * 10/2004 Exposito ............... H10F 39/804
257/E31.127
(Continued)

FOREIGN PATENT DOCUMENTS

CN        101689534 A      3/2010
CN        103681574 A      3/2014
(Continued)

OTHER PUBLICATIONS

International Preliminary Report on Patentability mailed Apr. 14, 2022 for PCT/JP2020/032645.

*Primary Examiner* — Sarah K Salerno
(74) *Attorney, Agent, or Firm* — Faegre Drinker Biddle & Reath LLP

(57) ABSTRACT

The photodetector includes a light receiving element and a package. The package has an accommodation member formed of a ceramic, a wiring including a pad connected to a terminal of the light receiving element by a wire, and a light transmitting member. A bottom wall of the accommodation member has a placement surface to which the light receiving element is attached by an adhesive member. The bottom wall or a side wall of the accommodation member has a pad surface on which the pad is disposed, the pad surface positioned on an opening side of the accommodation member with respect to the placement surface. The side wall has a through hole. At least a portion of an inner end portion of the through hole is positioned on the opening side with respect to a surface of the light receiving element on the opening side.

13 Claims, 7 Drawing Sheets

(56)        References Cited

U.S. PATENT DOCUMENTS

| | | | | |
|---|---|---|---|---|
| 2010/0327307 | A1* | 12/2010 | Ruhnau | H01L 33/60 |
| | | | | 257/E33.072 |
| 2012/0273264 | A1 | 11/2012 | Hashimoto et al. | |
| 2014/0070411 | A1 | 3/2014 | Okada | |
| 2016/0116701 | A1* | 4/2016 | Yamada | G02B 7/02 |
| | | | | 348/374 |

FOREIGN PATENT DOCUMENTS

| | | | |
|---|---|---|---|
| CN | 105009289 | A | 10/2015 |
| CN | 105683725 | A | 6/2016 |
| JP | 2007-128987 | A | 5/2007 |
| JP | 2007-165386 | A | 6/2007 |
| JP | 2009-081303 | A | 4/2009 |
| JP | 2009-289830 | A | 12/2009 |
| JP | 2009-290023 | A | 12/2009 |
| JP | 2010-177351 | A | 8/2010 |
| JP | 2015-216142 | A | 12/2015 |
| JP | 2019-050267 | A | 3/2019 |
| TW | 200849498 | A | 12/2008 |
| WO | WO-2005/031871 | A1 | 4/2005 |
| WO | WO-2017/033504 | A1 | 3/2017 |
| WO | WO-2017/200011 | A1 | 11/2017 |

* cited by examiner

1

2   45   41a   51(5)

40

43

42b

3

42c

51(5)

10
12

47   11   42a   42   46   51(5)

C1

C2

8
22

9

6

44

21

2a 8
22

8
22   51(5)

22

8

Y
Z → X

PHOTODETECTOR

TECHNICAL FIELD

The present disclosure relates to a photodetector.

BACKGROUND ART

A photodetector including a light receiving element and a package accommodating the light receiving element, in which the package includes an accommodation member formed of a ceramic and a light transmitting member attached to the accommodation member such that an opening of a recess portion of the accommodation member is covered, is known (for example, refer to Patent Literature 1). An accommodation member formed of a ceramic has excellent heat dissipation and heat resistance compared to an accommodation member formed of a resin, for example.

CITATION LIST

Patent Literature

[Patent Literature 1] Japanese Unexamined Patent Publication No. 2015-216142

SUMMARY OF INVENTION

Technical Problem

In the photodetector described above, when a wiring is provided in the package, how reliably electrical connection between the wiring and the light receiving element can be performed becomes a problem. On the other hand, how reliably occurrence of dew condensation inside the package can be prevented becomes another problem.

An object of the present disclosure is to provide a photodetector in which electrical connection between a wiring provided in a package and a light receiving element accommodated inside the package can be reliably performed and occurrence of dew condensation inside the package can be reliably prevented.

Solution to Problem

A photodetector according to an aspect of the present disclosure includes a light receiving element provided with a light receiving portion and a terminal, and a package accommodating the light receiving element. The package has an accommodation member including a bottom wall and a side wall defining an opening facing the bottom wall, the accommodation member formed of a ceramic, a wiring including a pad connected to the terminal by a wire, the wiring provided in the accommodation member, and a light transmitting member attached to the side wall such that the opening is covered. The bottom wall has a placement surface to which the light receiving element is attached by an adhesive member. The bottom wall or the side wall has a pad surface on which the pad is disposed, the pad surface positioned on the opening side with respect to the placement surface. The side wall has a through hole allowing communication between the inside of the package and the outside of the package. At least a portion of an inner end portion of the through hole is positioned on the opening side with respect to a surface of the light receiving element on the opening side.

In the photodetector of the aspect of the present disclosure, in the accommodation member formed of a ceramic, the pad surface on which the pad of the wiring is disposed is positioned on the opening side of the accommodation member with respect to the placement surface to which the light receiving element is attached by the adhesive member. Accordingly, the adhesive member is unlikely to reach the pad surface. Therefore, the terminal and the pad for the wiring corresponding to each other in the light receiving element are reliably connected to each other by the wire. Moreover, in the photodetector of the aspect of the present disclosure, in the accommodation member formed of a ceramic, at least a portion of the inner end portion of the through hole formed in the side wall is positioned on the opening side of the accommodation member with respect to the surface of the light receiving element on the opening side. Accordingly, the inner end portion of the through hole is unlikely to be blocked by the adhesive member. Therefore, ventilation between the inside and the outside of the package is secured, and occurrence of dew condensation inside the package is reliably prevented. Hence, according to the photodetector of the aspect of the present disclosure, electrical connection between the wiring provided in the package and the light receiving element accommodated inside the package can be reliably performed, and occurrence of dew condensation inside the package can be reliably prevented.

In the photodetector of the aspect of the present disclosure, at least a portion of the inner end portion of the through hole may be positioned on the opening side with respect to the pad surface. Accordingly, even if a foreign substance intrudes into the package through the through hole, the foreign substance can be easily captured on the pad surface. Moreover, the light receiving portion of the light receiving element is separated from the inner end portion of the through hole by an amount corresponding to a thickness of the pad surface therebetween. Hence, even if a foreign substance intrudes into the package through the through hole, arrival of the foreign substance at the light receiving portion of the light receiving element can be curbed.

In the photodetector of the aspect of the present disclosure, the through hole may have a bent portion. Accordingly, intrusion of a foreign substance into the package through the through hole can be curbed.

In the photodetector of the aspect of the present disclosure, an internal surface of the through hole may exhibit a rounded shape at the bent portion. Accordingly, the accommodation member is unlikely to break at the bent portion. Therefore, intrusion of a foreign substance into the package caused by such breakage can be curbed.

In the photodetector of the aspect of the present disclosure, the through hole may be a single hole. Accordingly, compared to when there are a plurality of through holes, intrusion of a foreign substance into the package through the through hole can be curbed.

In the photodetector of the aspect of the present disclosure, an inner surface of the side wall may have an inside corner portion when viewed in a direction in which the bottom wall and the opening face each other. The inner end portion of the through hole may be positioned at the inside corner portion. Accordingly, smooth ventilation between the inside and the outside of the package can be achieved.

In the photodetector of the aspect of the present disclosure, the side wall may have a corner portion when viewed in a direction in which the bottom wall and the opening face each other. The through hole may be formed at the corner portion. Accordingly, a length of the through hole can be increased, and intrusion of a foreign substance into the package through the through hole can be curbed.

In the photodetector of the aspect of the present disclosure, the side wall may include a plurality of side wall portions. An outer end portion of the through hole may be positioned on an outer surface of a side wall portion having the largest thickness of the plurality of side wall portions. Accordingly, the length of the through hole can be increased, and intrusion of a foreign substance into the package through the through hole can be curbed.

In the photodetector of the aspect of the present disclosure, a recess portion may be formed on an outer surface of the side wall. An outer end portion of the through hole may be positioned in the recess portion. Accordingly, intrusion of a foreign substance into the outer end portion of the through hole can be curbed.

In the photodetector of the aspect of the present disclosure, the wiring may include a plurality of connection portions extending in a direction in which the bottom wall and the opening face each other on an outer surface of the side wall. A distance between a connection portion closest to the outer end portion of the through hole of the plurality of connection portions and the outer end portion of the through hole may be longer than a distance between the connection portion closest to the outer end portion of the through hole of the plurality of connection portions and a connection portion second closest to the outer end portion of the through hole of the plurality of connection portions. Accordingly, blocking of the outer end portion of the through hole by a reflow material which has melted when the photodetector is mounted can be curbed.

In the photodetector of the aspect of the present disclosure, a center position of the light receiving portion may coincide with a center position of the package in at least a predetermined direction when viewed in a direction in which the bottom wall and the opening face each other. Accordingly, when the photodetector is mounted, positioning of the light receiving portion can be performed based on the package in at least a predetermined direction.

In the photodetector of the aspect of the present disclosure, the inner end portion of the through hole may be positioned on a side opposite to the center position of the light receiving portion with respect to the center position of the package in at least a predetermined direction when viewed in a direction in which the bottom wall and the opening face each other. Accordingly, the light receiving portion of the light receiving element is separated from the inner end portion of the through hole in at least a predetermined direction. Therefore, even if a foreign substance intrudes into the package through the through hole, arrival of the foreign substance at the light receiving portion of the light receiving element can be curbed.

In the photodetector of the aspect of the present disclosure, a gap may be formed between the light receiving element and the side wall. Accordingly, even if a foreign substance intrudes into the package through the through hole, the foreign substance can be easily captured by the gap between the light receiving element and the side wall. Therefore, arrival of a foreign substance at the light receiving portion of the light receiving element can be curbed.

In the photodetector of the aspect of the present disclosure, a height difference between the surface of the light receiving element on the opening side and the pad surface may be smaller than a thickness of the light receiving element. Accordingly, connection of the wire to the terminal of the light receiving element and the pad of the wiring corresponding to each other can be easily performed.

Advantageous Effects of Invention

According to the present disclosure, it is possible to provide a photodetector in which electrical connection between a wiring provided in a package and a light receiving element accommodated inside the package can be reliably performed and occurrence of dew condensation inside the package can be reliably prevented.

DESCRIPTION OF EMBODIMENT

Hereinafter, an embodiment of the present disclosure will be described in detail with reference to the drawings. In each of the diagrams, the same reference signs are applied to parts which are the same or corresponding, and duplicate description thereof will be omitted.

Figure 1:
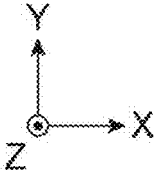
FIG. 1 is a plan view of a photodetector of an embodiment.
Figure 2:
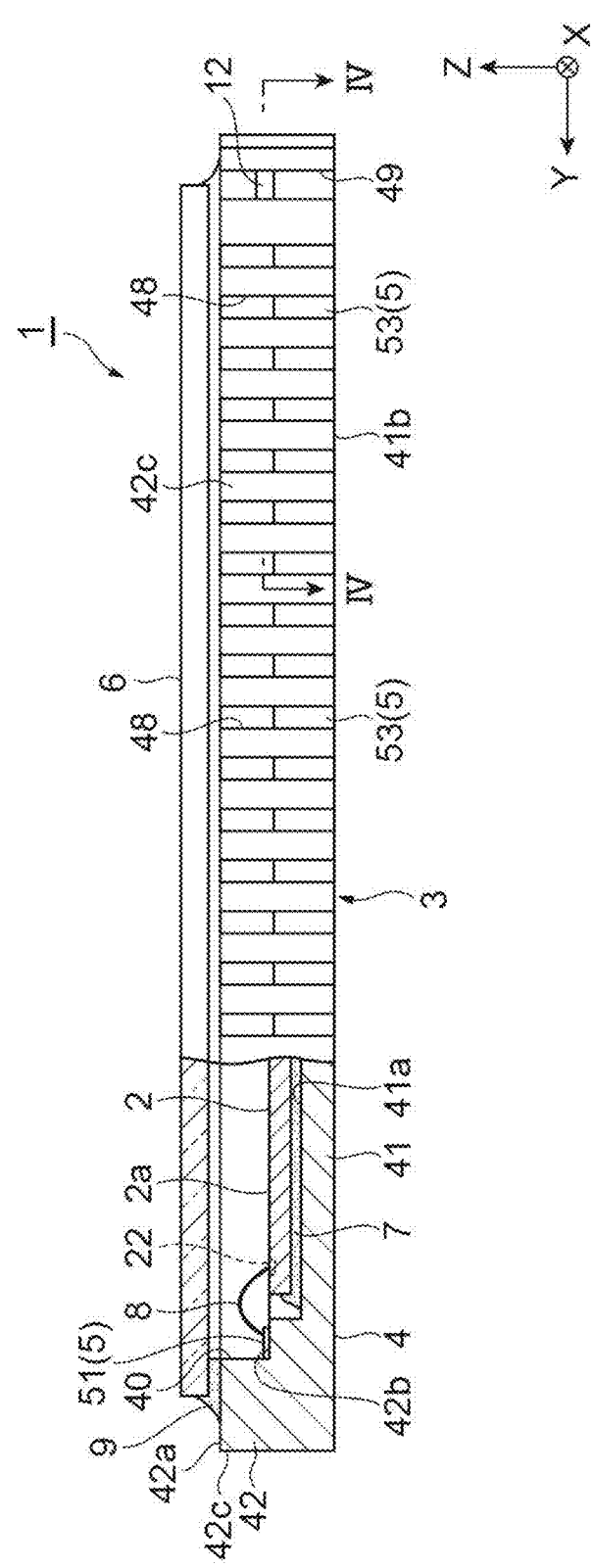
FIG. 2 is a side view of the photodetector illustrated in FIG. 1.
Figure 3:
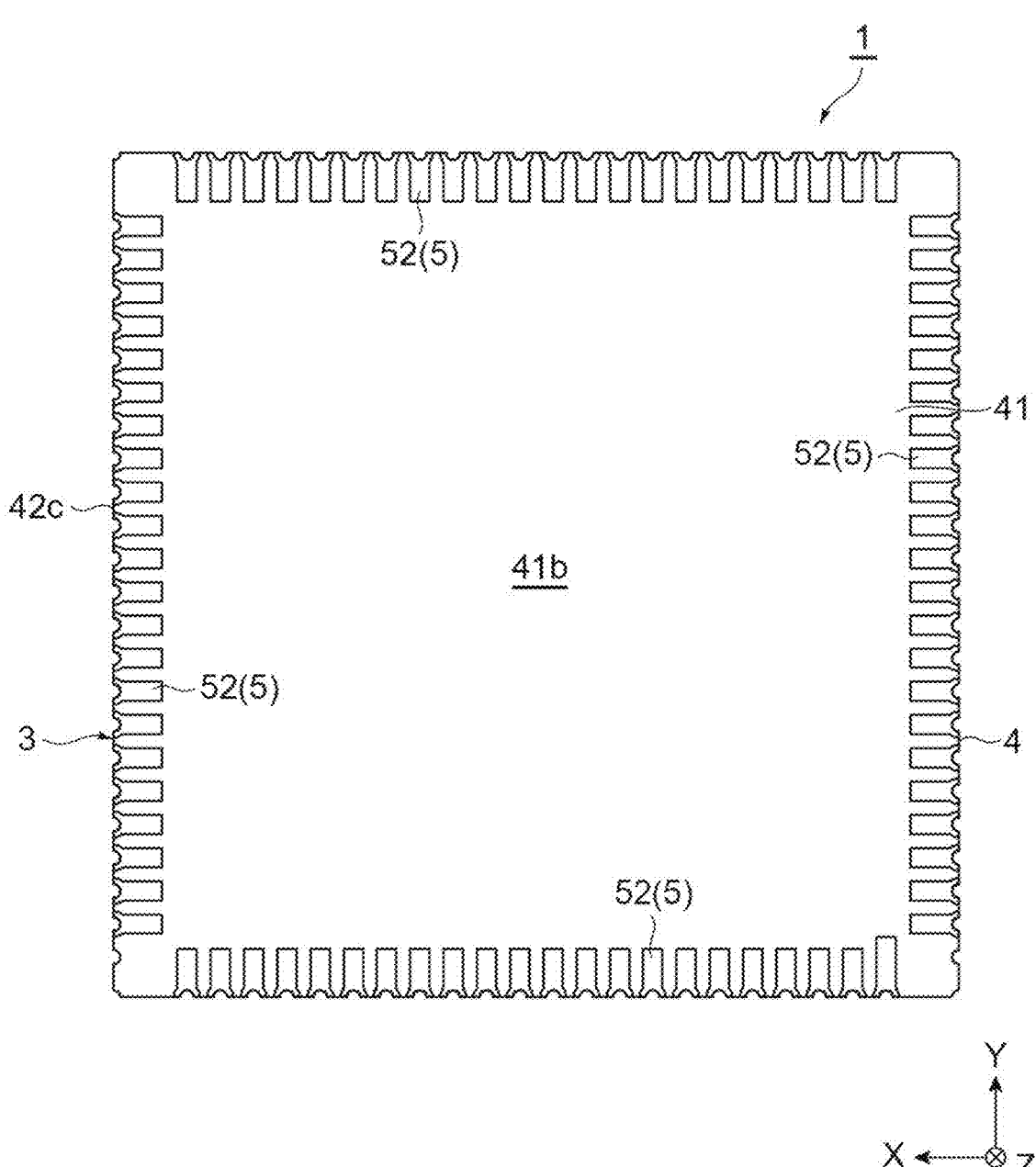
FIG. 3 is a bottom view of the photodetector illustrated in FIG. 1.

As illustrated in FIGS. 1, 2, and 3, a photodetector 1 includes a light receiving element 2 and a package 3 accommodating the light receiving element 2. The package 3 has an accommodation member 4, a plurality of wirings 5, and a light transmitting member 6. Hereinafter, an incident direction of light with respect to the photodetector 1 will be referred to as a Z direction, a direction perpendicular to the Z direction will be referred to as an X direction, and a direction perpendicular to both the Z direction and the X direction will be referred to as a Y direction.

The light receiving element 2 is a rear incident-type solid state imaging element (for example, a CMOS image sensor). For example, the light receiving element 2 exhibits a rectangular plate shape having each of the X direction and the Y direction as an extending direction of each side and having the Z direction as a thickness direction thereof. As an example, a length of each side of the light receiving element 2 is approximately around ten mm, and a thickness of the light receiving element 2 is approximately several hundred μm.

The light receiving element 2 is provided with a light receiving portion 21 and a plurality of terminals 22. For example, the light receiving portion 21 exhibits a rectangular shape having each of the X direction and the Y direction as an extending direction of each side. As an example, a length of each side of the light receiving portion 21 is approximately several mm to around ten mm. In the light receiving element 2, the light receiving portion 21 is offset to one side in the X direction (the left side in FIG. 1) and one side in the Y direction (the upper side in FIG. 1). Regions other than the light receiving portion 21 in the light receiving element 2 is provided with circuits such as a CMOS reading circuit, a vertical scanning circuit, and a horizontal scanning circuit (not illustrated). The plurality of terminals 22 are disposed along an outer edge of a surface 2a of the light receiving element 2. Each of the terminals 22 is buried on the surface 2a in an exposed state on the surface 2a. Each of the terminals 22 is electrically connected to the circuits of the light receiving element 2.

The accommodation member 4 includes a bottom wall 41 and a side wall 42 and is formed of a ceramic. The bottom wall 41 and the side wall 42 are integrally formed by sintering of a laminate. The bottom wall 41 is a part between a flat surface including a placement surface 41a (which will be described below) and an outer surface 41b in the accommodation member 4. For example, the bottom wall 41 exhibits a rectangular plate shape having each of the X direction and the Y direction as an extending direction of each side and having the Z direction as a thickness direction thereof. As an example, a length of each side of the bottom wall 41 is approximately around ten mm, and a thickness of the bottom wall 41 (that is, a distance between a flat surface including the placement surface 41a and the outer surface 41b) is approximately several hundred μm. The side wall 42 defines an opening 40 facing the bottom wall 41 in the Z direction. For example, the side wall 42 exhibits a rectangular frame shape extending along an outer edge of the bottom wall 41. As an example, a height of the side wall 42 is approximately several hundred μm, and a thickness of the side wall 42 is approximately several mm.

The side wall 42 is constituted of a plurality of side wall portions 43, 44, 45, and 46. The side wall portion 43 is positioned on one side in the X direction (the left side in FIG. 1). The side wall portion 44 is positioned on the other side in the X direction (the right side in FIG. 1). The side wall portion 45 is positioned on one side in the Y direction (the upper side in FIG. 1). The side wall portion 46 is positioned on the other side in the Y direction (the lower side in FIG. 1).

The placement surface 41a is formed in the bottom wall 41. The placement surface 41a is an inner surface of the bottom wall 41 on the opening 40 side. The light receiving element 2 is attached to the placement surface 41a by an adhesive member 7 in a state in which the surface 2a of the light receiving element 2 faces the opening 40 side. The surface 2a of the light receiving element 2 on the opening 40 side is positioned between the placement surface 41a and an end surface 42a of the side wall 42 (an end surface of the side wall 42 on a side opposite to the bottom wall 41) in the Z direction. A gap is formed between the light receiving element 2 and the side wall 42. As an example, a width of the gap is approximately several hundred μm.

A pad surface 42b is formed in the side wall 42. The pad surface 42b extends along an inner edge of the side wall 42. The pad surface 42b is positioned on the opening 40 side with respect to the placement surface 41a of the bottom wall 41 and positioned on the bottom wall 41 side with respect to the end surface 42a of the side wall 42 in the Z direction. Namely, the pad surface 42b is positioned between the placement surface 41a and the end surface 42a in the Z direction. A height difference between the surface 2a of the light receiving element 2 and the pad surface 42b (that is, a distance between the surface 2a and the pad surface 42b in the Z direction) is smaller than the thickness of the light receiving element 2. In the present embodiment, the height difference between the surface 2a of the light receiving element 2 and the pad surface 42b is substantially zero. The width of the gap formed between the light receiving element 2 and the side wall 42 is smaller than a width of the pad surface 42b (a width of the pad surface 42b in a direction perpendicular to the extending direction of the pad surface 42b extending along the inner edge of the side wall 42).

The plurality of wirings 5 are provided in the accommodation member 4. Each of the wirings 5 reaches the outer surface 41b of the bottom wall 41 from the pad surface 42b via the inside of the side wall 42 and an outer surface 42c of the side wall 42. A material of each of the wirings 5 is a metal, for example. Each of the wirings 5 includes pads 51 and 52 and a connection portion 53. The pad 51 is disposed on the pad surface 42b. The pad 52 is disposed along an outer edge of the outer surface 41b of the bottom wall 41. The connection portion 53 extends in the Z direction on the outer surface 42c of the side wall 42. For example, the accommodation member 4 and the plurality of wirings 5 are integrally formed by baking a laminate of green sheets on which a wiring pattern is formed. The terminal 22 and the pad 51 for the wiring 5 corresponding to each other in the light receiving element 2 are electrically connected to each other by a wire 8.

The light transmitting member 6 is attached to the side wall 42 such that the opening 40 is covered. The light transmitting member 6 is attached to the end surface 42a of the side wall 42 by an adhesive member 9. The material of the light transmitting member 6 is a glass, for example. For example, the light transmitting member 6 exhibits a rectangular plate shape having each of the X direction and the Y direction as an extending direction of each side and having the Z direction as a thickness direction thereof. As an example, a length of each side of the light transmitting member 6 is approximately around ten mm, and a thickness of the light transmitting member 6 is approximately several hundred μm. The light transmitting member 6 is separated from the light receiving element 2 and a plurality of wires 8.

As described above, the light receiving portion 21 is offset to one side in the X direction (the left side in FIG. 1) in the light receiving element 2. However, when viewed in the Z direction (in a direction in which the bottom wall 41 and the opening 40 face each other), a center position C1 of the light receiving portion 21 coincides with a center position C2 of the package 3 in the X direction (predetermined direction). This is realized by causing a thickness of the side wall portion 43 positioned on one side in the X direction (the left side in FIG. 1) to be larger than a thickness of the side wall portion 44 positioned on the other side in the X direction (the right side in FIG. 1). The center position C1 of the light receiving portion 21 is also a centroidal position of the light receiving portion 21 when viewed in the Z direction, and the center position C2 of the package 3 is also a centroidal position of the package 3 when viewed in the Z direction.

A through hole 10 is formed at a corner portion 47 of the side wall 42. The corner portion 47 is a corner portion of the side wall 42 when viewed in the Z direction and is a corner portion formed by the side wall portion 43 and the side wall portion 46. Only one through hole 10 is formed in the side wall 42. The through hole 10 allows communication between the inside of the package 3 (that is, an inner space of the package 3) and the outside of the package 3 (that is, an outer space of the package 3). An inner end portion 11 of the through hole 10 is positioned on an inner surface 42d of the side wall 42, and an outer end portion 12 of the through hole 10 is positioned on the outer surface 42c of the side wall 42. When viewed in the Z direction, the inner end portion 11 of the through hole 10 is positioned on a side opposite to the light receiving portion 21 with respect to the center position C2 of the package 3 in the Y direction (predetermined direction).

Figure 4:
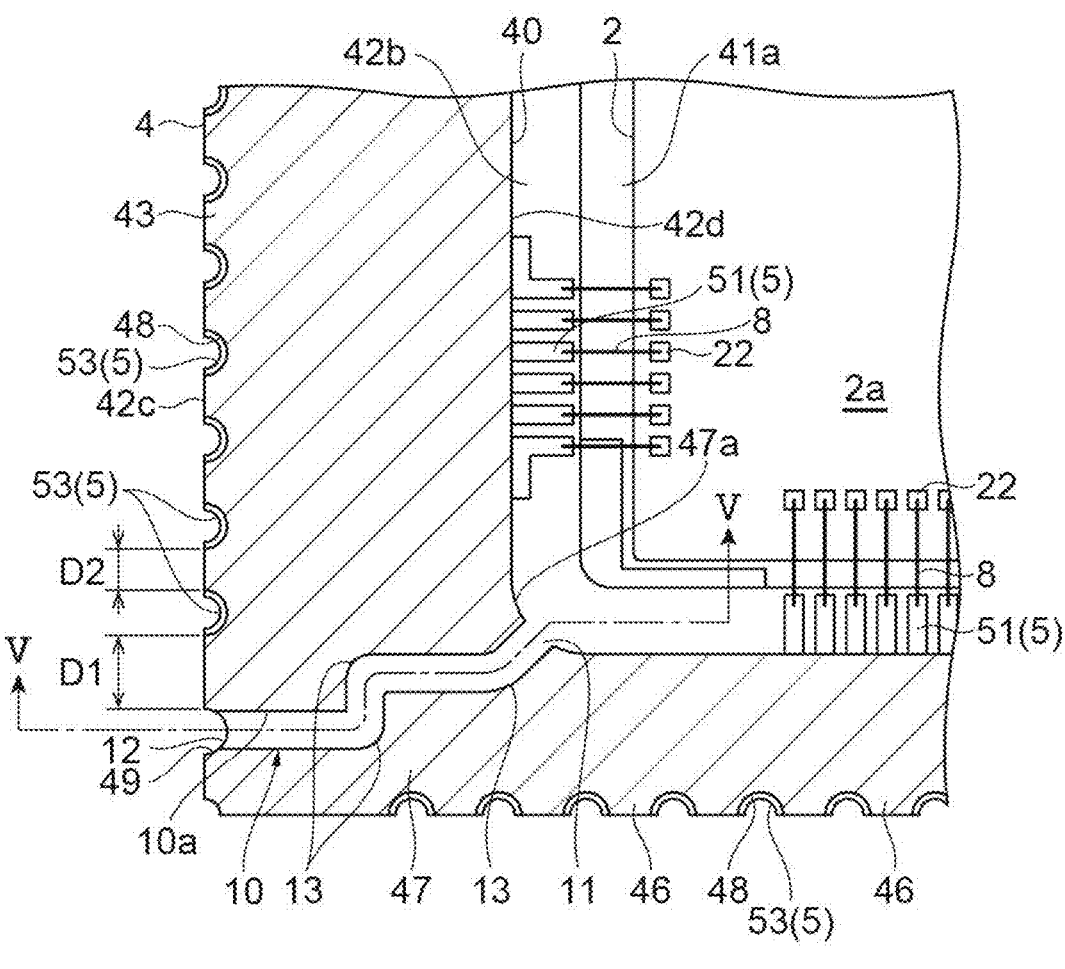
FIG. 4 is a cross-sectional view along line IV-IV illustrated in FIG. 2.
Figure 4:
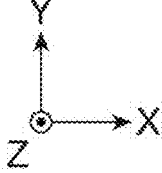
Figure 5:
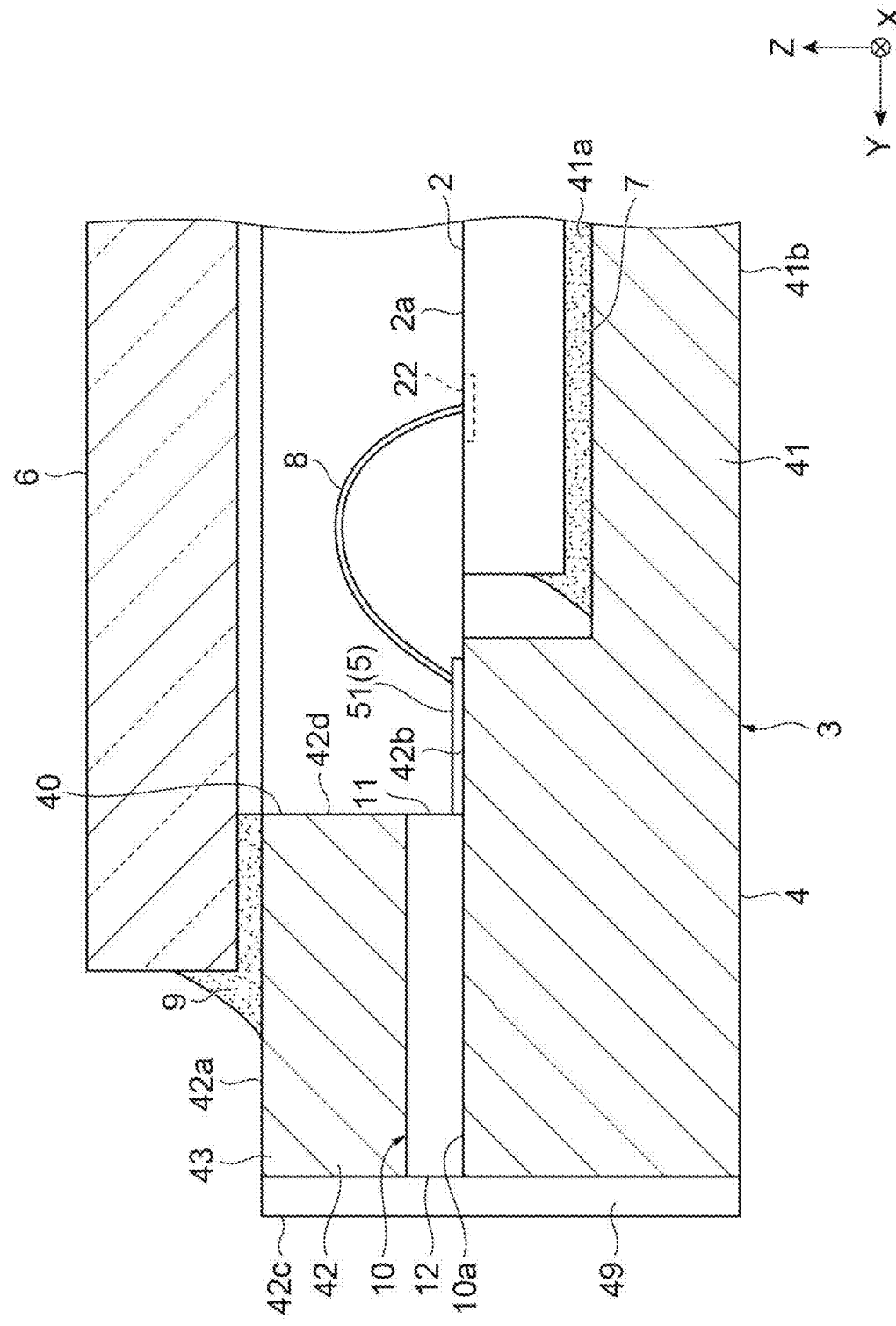
FIG. 5 is a cross-sectional view along line V-V illustrated in FIG. 4.

As illustrated in FIGS. 4 and 5, the inner end portion 11 of the through hole 10 is positioned on the opening 40 side with respect to the surface 2a of the light receiving element 2 in the Z direction. In the present embodiment, the entirety of the through hole 10 including the inner end portion 11 and the outer end portion 12 of the through hole 10 is positioned on the opening 40 side through a wire the pad surface 42b in the Z direction. The cross-sectional shape of the through hole 10 is a rectangular shape, for example. As an example, each of the width and the height of the through hole 10 is approximately several hundred μm, and the width of the through hole 10 is larger than the height of the through hole 10.

The inner end portion 11 of the through hole 10 is positioned on at an inside corner portion 47a on the inward side in the corner portion 47. The inside corner portion 47a is an inside corner portion of the inner surface 42d of the side wall 42 when viewed in the Z direction.

The outer end portion 12 of the through hole 10 is positioned on an outer surface of the side wall portion 43. The side wall portion 43 is a side wall portion having the largest thickness of the plurality of side wall portions 43, 44, 45, and 46 constituting the side wall 42. The through hole 10 has a plurality of bent portions 13. An internal surface 10a of the through hole 10 exhibits a rounded shape (that is, a round-chamfered shape) in each of the bent portions 13 when viewed in the Z direction.

A plurality of groove portions 48 and one groove portion (recess portion) 49 are formed on the outer surface 42c of the side wall 42. Each of the groove portions 48 and 49 extends in the Z direction. The cross-sectional shape of each of the groove portions 48 and 49 is a U-shape, for example. As an example, each of the width and the depth of each of the groove portions 48 and 49 is approximately several hundred μm. The connection portion 53 of the wiring 5 is disposed in each of the groove portions 48. The outer end portion 12 of the through hole 10 is positioned in the groove portion 49. The connection portion 53 of the wiring 5 is not disposed in the groove portion 49. A distance D1 between the connection portion 53 closest to the outer end portion 12 of the through hole 10 of a plurality of connection portions 53 and the outer end portion 12 of the through hole 10 is longer than a distance D2 between the connection portion 53 closest to the outer end portion 12 of the through hole 10 of the plurality of connection portions 53 and the connection portion 53 second closest to the outer end portion 12 of the through hole 10 of the plurality of connection portions 53.

As described above, in the photodetector 1, in the accommodation member 4 formed of a ceramic, the pad surface 42b on which the pad 51 of each of the wirings 5 is disposed is positioned on the opening 40 side with respect to the placement surface 41a to which the light receiving element 2 is attached by the adhesive member 7. Accordingly, the adhesive member 7 is unlikely to reach the pad surface 42b. Therefore, the terminal 22 and the pad 51 for the wiring 5 corresponding to each other in the light receiving element 2 are reliably connected to each other by the wire 8. Moreover, in the photodetector 1, in the accommodation member 4 formed of a ceramic, the inner end portion 11 of the through hole 10 formed in the side wall 42 is positioned on the opening 40 side with respect to the surface 2a of the light receiving element 2. Accordingly, the inner end portion 11 of the through hole 10 is unlikely to be blocked by the adhesive member 7. Therefore, ventilation between the inside and the outside of the package 3 is secured, and occurrence of dew condensation (for example, dew condensation occurring due to a temperature difference caused by a reflow step when the photodetector 1 is mounted) inside the package 3 is reliably prevented. Hence, according to the photodetector 1, electrical connection between the plurality of wirings 5 provided in the package 3 and the light receiving element 2 accommodated inside the package 3 can be reliably performed, and occurrence of dew condensation inside the package 3 can be reliably prevented.

In the photodetector 1, the inner end portion 11 of the through hole 10 is positioned on the opening 40 side with respect to the surface 2a of the light receiving element 2. Therefore, air can be smoothly discharged from the inside of the package 3 to the outside of the package 3. In addition, since the inner end portion 11 of the through hole 10 is positioned on the opening 40 side with respect to the surface 2a of the light receiving element 2, even if gas is generated from the adhesive member 9, the gas can be efficiently discharged from the inside of the package 3 to the outside of the package 3. Moreover, since the inner end portion 11 of the through hole 10 is positioned on the opening 40 side with respect to the surface 2a of the light receiving element 2 and the inner end portion 11 of the through hole 10 is unlikely to be blocked by the adhesive member 7, the distance between the light receiving element 2 and the side wall 42 can be reduced, and thus miniaturization of the photodetector 1 can be achieved. In addition, if the light receiving element 2 is a rear incident-type solid state imaging element and a resin adhesive member is used between a support substrate and a device layer, dew condensation is likely to occur inside the package 3 due to hygroscopic properties of the resin adhesive member. Therefore, it is particularly effective to provide the through hole 10 in the accommodation member 4.

In the photodetector 1, the inner end portion 11 of the through hole 10 is positioned on the opening 40 side with respect to the pad surface 42b. Accordingly, even if a foreign substance intrudes into the package 3 through the through hole 10, the foreign substance can be easily captured on the pad surface 42b. Moreover, the light receiving portion 21 is separated from the inner end portion 11 of the through hole 10 by an amount corresponding to a thickness of the pad surface 42b therebetween. Hence, even if a foreign substance intrudes into the package 3 through the through hole 10, arrival of the foreign substance at the light receiving portion 21 can be curbed.

In the photodetector 1, the inner end portion 11 of the through hole 10 is positioned on the opening 40 side with respect to the pad surface 42b. Therefore, the degree of freedom in laying the plurality of wirings 5 can be secured at a part on the bottom wall 41 side of the pad surface 42b in the side wall 42.

In the photodetector 1, the through hole 10 has the plurality of bent portions 13. Accordingly, intrusion of a foreign substance into the package 3 through the through hole 10 can be curbed.

In the photodetector 1, the internal surface 10a of the through hole 10 exhibits a rounded shape in each of the bent portions 13. Accordingly, the accommodation member 4 is unlikely to break at each of the bent portions 13. Therefore, intrusion of a foreign substance into the package 3 caused by such breakage can be curbed.

In the photodetector 1, the through hole 10 is a single hole. Accordingly, compared to when there are a plurality of through holes 10, intrusion of a foreign substance into the package 3 through the through hole 10 can be curbed.

In the photodetector 1, the inner end portion 11 of the through hole 10 is positioned at the inside corner portion 47a on the inner surface 42d of the side wall 42. Accordingly, smooth ventilation between the inside and the outside of the package 3 can be achieved.

In the photodetector 1, the through hole 10 is formed at the corner portion 47 in the side wall 42. Accordingly, a length of the through hole 10 can be increased, and intrusion of a foreign substance into the package 3 through the through hole 10 can be curbed.

In the photodetector 1, the outer end portion 12 of the through hole 10 is positioned on the outer surface of the side wall portion 43 having the largest thickness of the plurality of side wall portions 43, 44, 45, and 46. Accordingly, the length of the through hole 10 can be increased, and intrusion of a foreign substance into the package 3 through the through hole 10 can be curbed.

In the photodetector 1, the outer end portion 12 of the through hole 10 is positioned in the groove portion 49 formed on the outer surface 42c of the side wall 42. Accordingly, intrusion of a foreign substance into the outer end portion 12 of the through hole 10 can be curbed.

In the photodetector 1, the distance D1 between the connection portion 53 closest to the outer end portion 12 of the through hole 10 of the plurality of connection portions 53 and the outer end portion 12 of the through hole 10 is longer than the distance D2 between the connection portion 53 closest to the outer end portion 12 of the through hole 10 of the plurality of connection portions 53 and the connection portion 53 second closest to the outer end portion 12 of the through hole 10 of the plurality of connection portions 53. Accordingly, blocking of the outer end portion 12 of the through hole 10 by a reflow material which has melted when the photodetector 1 is mounted can be curbed.

In the photodetector 1, when viewed in the Z direction, the center position C1 of the light receiving portion 21 coincides with the center position C2 of the package 3 in the X direction. Accordingly, when the photodetector 1 is mounted, positioning of the light receiving portion 21 can be performed based on the package 3 in the X direction.

In the photodetector 1, the inner end portion 11 of the through hole 10 is positioned on a side opposite to the center position C1 of the light receiving portion 21 with respect to the center position C2 of the package 3 in the Y direction when viewed in the Z direction. Accordingly, the light receiving portion 21 is separated from the inner end portion 11 of the through hole 10 in the Y direction. Therefore, even if a foreign substance intrudes into the package 3 through the through hole 10, arrival of the foreign substance at the light receiving portion 21 can be curbed.

In the photodetector 1, a gap is formed between the light receiving element 2 and the side wall 42. Accordingly, even if a foreign substance intrudes into the package 3 through the through hole 10, the foreign substance can be easily captured by the gap between the light receiving element 2 and the side wall 42. Therefore, arrival of a foreign substance at the light receiving portion 21 can be curbed. In the photodetector 1, the width of the gap formed between the light receiving element 2 and the side wall 42 is smaller than the width of the pad surface 42b. Therefore, miniaturization of the entirety of the package 3 can be achieved. At this time, even if the width of the gap is reduced, the inner end portion 11 of the through hole 10 is positioned on the opening 40 side of the surface 2a of the light receiving element 2. Therefore, the inner end portion 11 of the through hole 10 is unlikely to be blocked by the adhesive member 7.

In the photodetector 1, the height difference between the surface 2a of the light receiving element 2 and the pad surface 42b is smaller than the thickness of the light receiving element 2. Accordingly, connection of the wire 8 to the terminal 22 of the light receiving element 2 and the pad 51 of the wiring 5 corresponding to each other can be easily performed.

The present disclosure is not limited to the embodiment described above. For example, regarding the position of the inner end portion 11 of the through hole 10, at least a portion of the inner end portion 11 of the through hole 10 need only be positioned on the opening 40 side of the pad surface 42b in the Z direction. If the entirety of the inner end portion 11 of the through hole 10 is positioned on the opening 40 side of the placement surface 41a in the Z direction, blocking of the inner end portion 11 of the through hole 10 by the adhesive member 7 can be curbed.

Figure 6:
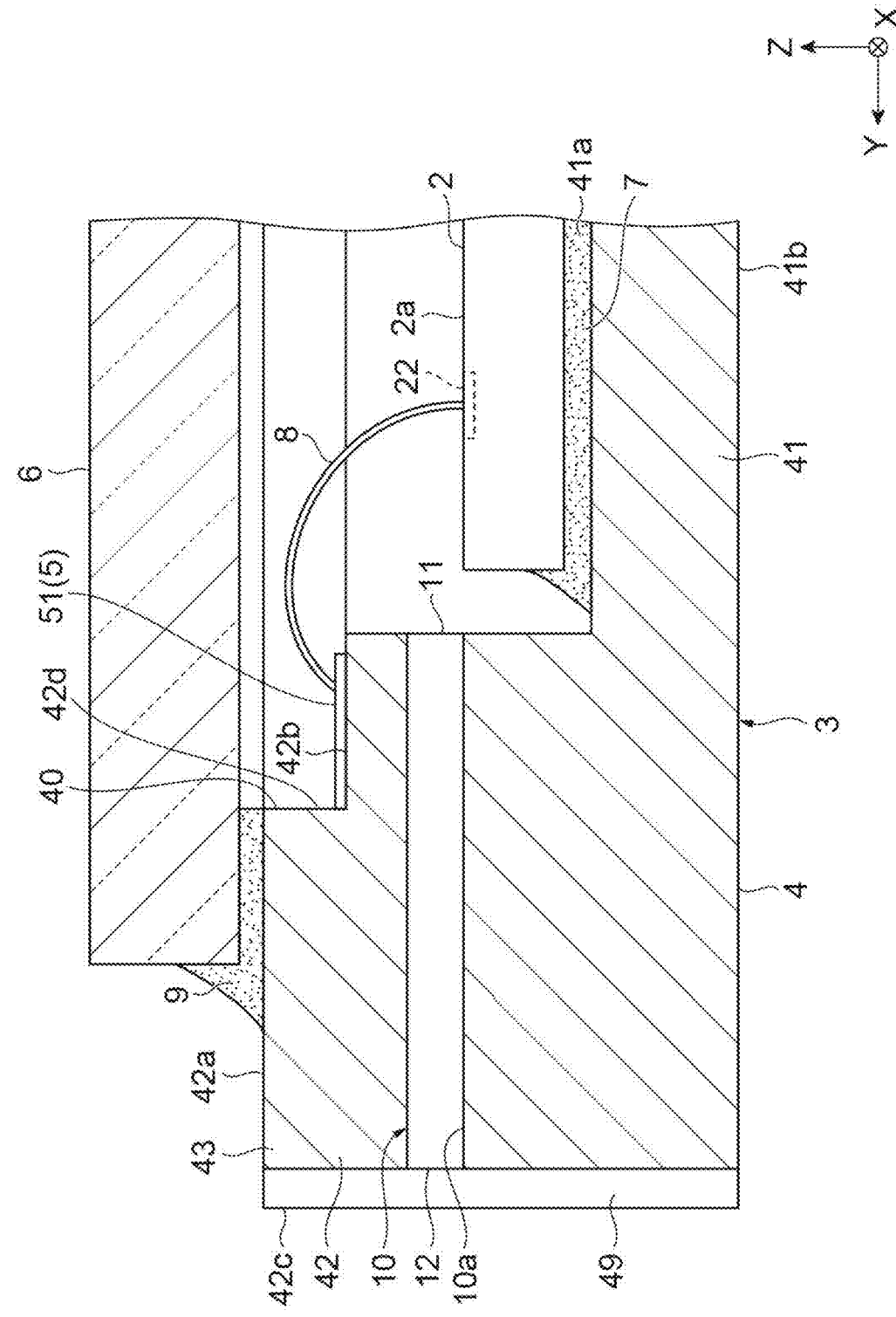
FIG. 6 is a cross-sectional view of the photodetector of a modification example.
Figure 7:
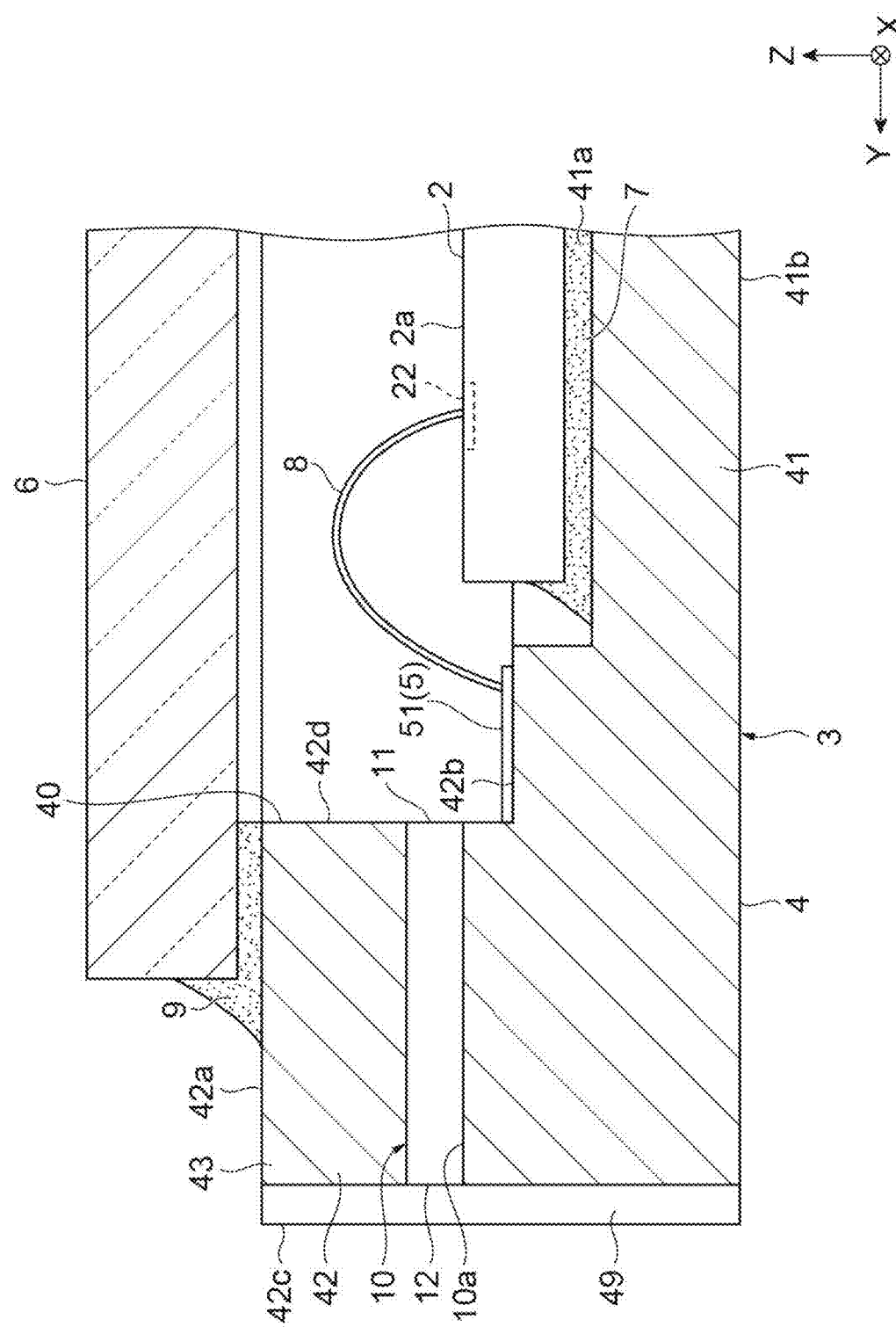
FIG. 7 is a cross-sectional view of the photodetector of another modification example.

In addition, at least a portion of the inner end portion 11 of the through hole 10 need only be positioned on the opening 40 side of the surface 2a of the light receiving element 2 in the Z direction. In such a case, as illustrated in FIG. 6, the pad surface 42b may be positioned on the opening 40 side with respect to the surface 2a of the light receiving element 2 in the Z direction, and at least a portion of the inner end portion 11 of the through hole 10 may be positioned between the pad surface 42b and the surface 2a of the light receiving element 2 in the Z direction. In addition, as illustrated in FIG. 7, the surface 2a of the light receiving element 2 may be positioned on the opening 40 side with respect to the pad surface 42b in the Z direction, and at least a portion of the inner end portion 11 of the through hole 10 may be positioned on the opening 40 side with respect to the pad surface 42b and the surface 2a of the light receiving element 2 in the Z direction.

In addition, the shape of the through hole 10 and the number thereof are not limited to those described above as long as the through hole 10 is formed in the side wall 42. For example, the through hole 10 need only have at least one bent portion 13. In addition, the through hole 10 may not have the bent portions 13. In addition, the outer end portion 12 of the through hole 10 may be positioned in a recess portion exhibiting a shape other than those of the groove portions 48. In addition, a plurality of through holes 10 may be formed in the side wall 42.

In addition, the light receiving element 2 may be a front incident-type solid state imaging element. In addition, the light receiving element 2 may be a PD array or the like. In addition, the pad surface 42b need only be formed in the bottom wall 41 or the side wall 42. However, from a viewpoint of miniaturizing the entirety of the package 3, it is more preferable to form the pad surface 42b in the side wall 42 than to form the pad surface 42b in the bottom wall 41.

REFERENCE SIGNS LIST

1: Photodetector, 2: Light receiving element, 2a: Surface, 21: Light receiving portion, 22: Terminal, 3: Package, 4: Accommodation member, 40: Opening, 41: Bottom wall, 41a: Placement surface, 42: Side wall, 42b: Pad surface, 42c: Outer surface, 42d: Inner surface, 43, 44, 45, 46: Side wall portion, 47: Corner portion, 47a: Inside corner portion, 49: Groove portion (recess portion), 5: Wiring, 51: Pad, 53: Connection portion, 6: Light transmitting member, 7: Adhesive member, 8: Wire, 10: Through hole, 10a: Internal surface, 11: Timer end portion, 12: Outer end portion, 13: Bent portion.

The invention claimed is:

1. A photodetector comprising:

a light receiving element provided with a light receiving portion and a terminal; and a package accommodating the light receiving element, wherein the package has an accommodation member including a bottom wall, and a side wall defining an opening facing the bottom wall, the accommodation member formed of a ceramic, a wiring including a pad connected to the terminal by a wire, the wiring provided in the accommodation member, and a light transmitting member attached to the side wall such that the opening is covered, wherein the bottom wall has a placement surface to which the light receiving element is attached by an adhesive member, wherein the bottom wall or the side wall has a pad surface on which the pad is disposed, the pad surface positioned at a level between the light transmitting member and the placement surface, wherein the side wall has a through hole allowing ventilation between the inside of the package and the outside of the package, wherein at least a portion of an inner end portion of the through hole is positioned on the opening side with respect to a surface of the light receiving element on the opening side, and a gap is formed between the light receiving element and the side wall, and a width of the gap is smaller than a width of the pad surface in a width direction of the gap.

2. The photodetector according to claim 1, wherein at least a portion of the inner end portion of the through hole is positioned on the opening side with respect to the pad surface.

3. The photodetector according to claim 1, wherein the through hole has a bent portion.

4. The photodetector according to claim 3, wherein an internal surface of the through hole exhibits a rounded shape at the bent portion.

5. The photodetector according to claim 1, wherein the through hole is a single hole.

6. The photodetector according to claim 1, wherein an inner surface of the side wall has an inside corner portion when viewed in a direction in which the bottom wall and the opening face each other, and wherein the inner end portion of the through hole is positioned at the inside corner portion.

7. The photodetector according to claim 1, wherein the side wall has a corner portion when viewed in a direction in which the bottom wall and the opening face each other, and wherein the through hole is formed at the corner portion.

8. The photodetector according to claim 1, wherein the side wall includes a plurality of side wall portions, and wherein an outer end portion of the through hole is positioned on an outer surface of a side wall portion having the largest thickness of the plurality of side wall portions.

9. The photodetector according to claim 1, wherein a recess portion is formed on an outer surface of the side wall, and wherein an outer end portion of the through hole is positioned in the recess portion.

10. The photodetector according to claim 1, wherein the wiring includes a plurality of connection portions extending in a direction in which the bottom wall and the opening face each other on an outer surface of the side wall, and wherein a distance between a connection portion closest to an outer end portion of the through hole of the plurality of connection portions and the outer end portion of the through hole is longer than a distance between the connection portion closest to the outer end portion of the through hole of the plurality of connection portions and a connection portion second closest to the outer end portion of the through hole of the plurality of connection portions.

11. The photodetector according to claim 1, wherein a center position of the light receiving portion coincides with a center position of the package in at least a predetermined direction when viewed in a direction in which the bottom wall and the opening face each other.

12. The photodetector according to claim 1, wherein the inner end portion of the through hole is positioned on a side opposite to the center position of the light receiving portion with respect to the center position of the package in at least a predetermined direction when viewed in a direction in which the bottom wall and the opening face each other.

13. The photodetector according to claim 1, wherein a height difference between the surface of the light receiving element on the opening side and the pad surface is smaller than a thickness of the light receiving element.

* * * * *